United States Patent
Bauer

(10) Patent No.: US 10,103,028 B2
(45) Date of Patent: Oct. 16, 2018

(54) CONTACT INTEGRATION AND SELECTIVE SILICIDE FORMATION METHODS

(71) Applicant: Applied Materials, Inc., Santa Clara, CA (US)

(72) Inventor: Matthias Bauer, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/417,638

(22) Filed: Jan. 27, 2017

(65) Prior Publication Data

US 2018/0076041 A1    Mar. 15, 2018

Related U.S. Application Data

(60) Provisional application No. 62/395,277, filed on Sep. 15, 2016.

(51) Int. Cl.
*H01L 21/20* (2006.01)
*H01L 21/285* (2006.01)
*H01L 21/02* (2006.01)
*H01L 21/8238* (2006.01)

(52) U.S. Cl.
CPC .. *H01L 21/28518* (2013.01); *H01L 21/02068* (2013.01); *H01L 21/823814* (2013.01); *H01L 21/823871* (2013.01)

(58) Field of Classification Search
CPC ......... H01L 21/76883; H01L 21/76886; H01L 21/76802; H01L 21/7684; H01L 21/7685; H01L 21/76843; H01L 21/76849
See application file for complete search history.

(56) References Cited

U.S. PATENT DOCUMENTS

| | | |
|---|---|---|
| 4,619,038 A | 10/1986 | Pintchovski |
| 5,401,674 A | 3/1995 | Anjum et al. |
| 5,924,009 A | 7/1999 | Park |
| 6,218,711 B1 | 4/2001 | Yu |
| 6,399,487 B1 | 6/2002 | Lai et al. |
| 2004/0127027 A1 | 7/2004 | Lee et al. |
| 2005/0255698 A1 | 11/2005 | Sandhu et al. |
| 2014/0138775 A1 | 5/2014 | Loubet et al. |
| 2015/0228724 A1 | 8/2015 | Kwok et al. |
| 2015/0333180 A1 | 11/2015 | Glass et al. |

OTHER PUBLICATIONS

International Search Report and Written Opinion for International Application No. PCT/US2017015121 dated Jun. 15, 2017.

*Primary Examiner* — Hoa (Vikki) B Trinh
(74) *Attorney, Agent, or Firm* — Patterson + Sheridan LLP

(57) ABSTRACT

Methods for selective silicide formation are described herein. The methods are generally utilized in conjunction with contact structure integration schemes and provide for improved silicide formation characteristics. In one implementation, a silicide material is selectively formed on source/drain (S/D) regions at a temperature less than about 550° C. The resulting silicide is believed to exhibit desirable contact resistance and applicability in advanced contact integration schemes.

20 Claims, 2 Drawing Sheets

CONTACT INTEGRATION AND SELECTIVE SILICIDE FORMATION METHODS

CROSS-REFERENCE TO RELATED APPLICATIONS

This application claims benefit of U.S. Provisional Patent Application No. 62/395,277, filed Sep. 15, 2016, the entirety of which is herein incorporated by reference.

BACKGROUND

Field

Implementations of the present disclosure generally relate to selective silicide formation methods for contact integration schemes.

Description of the Related Art

Titanium silicide is a promising material for silicide contacts in semiconductor device manufacturing. However, chemical vapor deposition (CVD) of titanium silicide is not selective for temperatures below 800° C. Moreover, conventional silicide formation exhibits less than desirable conformality and a post deposition anneal is often utilized to form low resistivity phase silicides. These variables are often time consuming and not compatible with thermal budgets for advanced node contact structure integration schemes.

Thus, what is needed in the art are improved silicide formation methods.

SUMMARY

In one implementation, a silicide formation method is provided. The method includes performing a contact trench etching process to expose source/drain (S/D) regions and performing a cleaning process on the exposed S/D regions. An epitaxial germanium deposition is performed on the S/D regions and a silicide formation process is performed in the S/D regions by exposing the epitaxially deposited germanium to a titanium containing precursor and a silicon containing precursor at a temperature less than about 550° C.

In another implementation, a silicide formation method is provided. The method includes performing a contact trench etching process to expose source/drain (S/D) regions and the exposed S/D regions include Group IV materials. An oxide removal process is performed on the exposed S/D regions and an epitaxial germanium deposition is performed on the S/D regions. A thermal chemical vapor deposition silicide formation process is performed on the S/D regions by exposing the epitaxially deposited germanium to a titanium containing precursor and a silicon containing precursor at a temperature less than about 500° C. to form a silicide material alloy comprising titanium, silicon, and germanium. The germanium is present in the alloy in a concentration of less than 10%.

In yet another implementation, a silicide formation method is provided. The method includes performing a contact trench etching process to expose pMOS type and nMOS type source/drain (S/D) regions, performing a first cleaning process on the exposed S/D regions, masking pMOS type S/D regions, performing an epitaxial germanium deposition on the pMOS type S/D regions, and removing the mask from the pMOS type S/D regions. The method further includes masking nMOS type S/D regions, performing an epitaxial germanium deposition on the nMOS type S/D regions, removing the mask from the nMOS type S/D regions, and performing a second cleaning process on the S/D regions. A silicide formation process is performed on the S/D regions by exposing the epitaxially deposited germanium to a titanium containing precursor and a silicon containing precursor at a temperature less than about 550° C.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only exemplary implementations and are therefore not to be considered limiting of its scope, may admit to other equally effective implementations.

Figure 1:
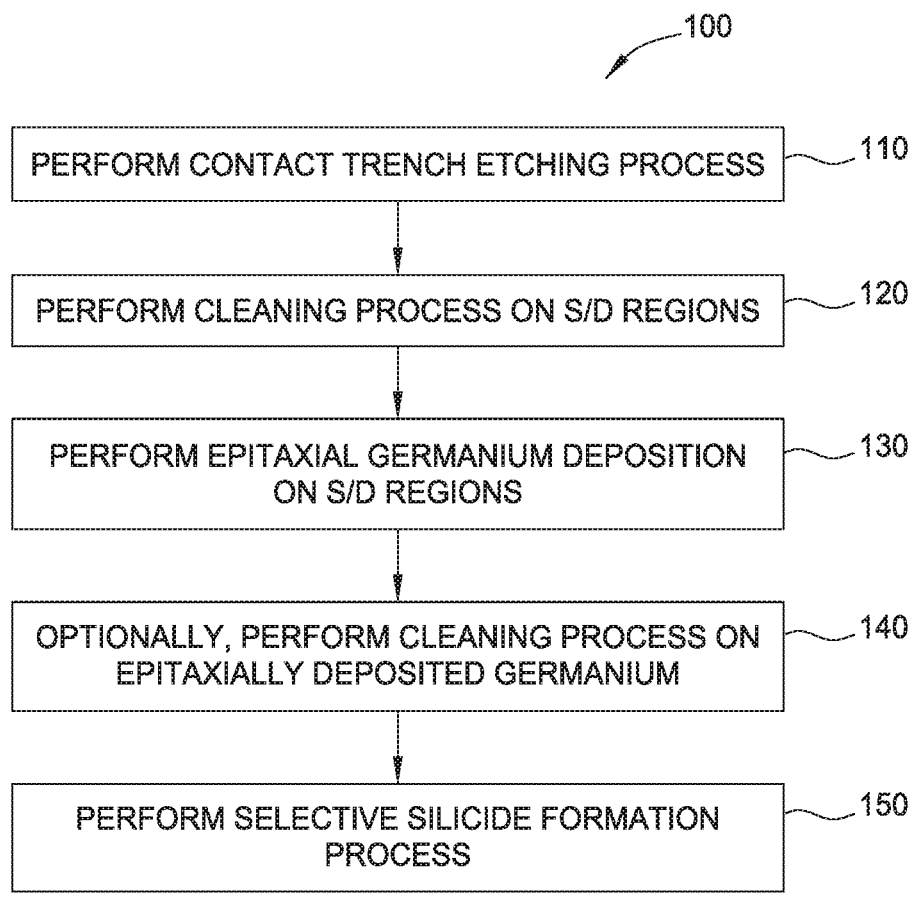
FIG. 1 illustrates operations of a method according to one implementation described herein.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

Methods for selective silicide formation are described herein. The methods are generally utilized in conjunction with contact structure integration schemes and provide for improved silicide formation characteristics. In one implementation, a silicide material is selectively formed on source/drain (S/D) regions at a temperature less than about 550° C. The resulting silicide is believed to exhibit desirable contact resistance and applicability in advanced contact integration schemes.

FIG. 1 illustrates operations of a method 100 for performing a selective silicide formation process. At operation 110, a contact trench etching process is performed. The etching process, such as a reactive ion etching process or the like, is performed to expose the source/drain (S/D) regions of a semiconductor device. It is contemplated that the implementations described herein may find suitable applicability in various integration schemes, such as silicide first and silicide last integration schemes. Similarly, the implementations described herein are believed to be beneficial for gate first and gate last integration schemes.

At operation 120, a cleaning process is performed on the S/D regions. The cleaning process may be performed prior to subsequent processing operations, such as silicide formation processes. In one implementation, the cleaning process is utilized to remove oxide, nitride, or other materials from the surfaces of the S/D regions. Suitable cleaning processes include the SICONI® pre-clean process available from Applied Materials, Santa Clara, Calif. However, it is contemplated that suitably configured cleaning processes from other manufacturers may also be implemented in accordance with the implementations described herein.

It is believed that the cleaning process described with regard to operation 120 substantially or entirely removes oxides, nitrides or other undesirable materials from the S/D regions to expose a surface of the S/D regions. In one implementation, the exposed surfaces of the S/D regions comprise Group IV materials, such as silicon and/or germanium. Other materials, such as phosphorous, indium, arsenic, gallium and the like may also be present at the exposed surfaces. In one implementation, the S/D regions are configured as nMOS type devices. In another implementation, the S/D regions are configured as pMOS type devices. It is contemplated that a substrate may be composed of entirely nMOS, entirely pMOS, or a combination of nMOS and pMOS devices.

At operation 130, an epitaxial germanium deposition process is performed on the S/D regions. In one implementation, the epitaxially deposited germanium may have a thickness between several angstroms and several nanometers, for example, between about 1 Å and about 10 nm, such as between about 5 Å and about 5 nm. It is contemplated that the epitaxial germanium layer deposited on the S/D regions may be suitable for both nMOS and pMOS device structures. In one implementation, the epitaxial germanium layer is also doped with gallium. Thus, device specific (i.e. nMOS, pMOS) S/D interface engineering is simplified and the efficiency of contact integration may be improved.

At operation 140, the epitaxial germanium layer formed on the S/D region is optionally cleaned. For example, if a native oxide is formed on the germanium layer, a SICONI® or other suitable oxide removal process may be performed to prepare the germanium layer for subsequent silicide formation processes. It is believed that the germanium layer provides for additional semiconductive material at the S/D and silicide interface to prevent or reduce the consumption of the S/D material during silicide formation.

At operation 150, a selective silicide formation process is performed. In one implementation, the selective silicide formation process is a thermal CVD process performed at a temperature of less than about 550° C., such as less than about 500° C. In one implementation, $TiCl_4$ is utilized as a titanium precursor and $SiH_4$ is utilized as a silicon precursor. In another implementation, a more massive halogen may be utilized, such as a $TiBr_4$ or $TiI_4$, to reduce the decomposition energy of the compound at the reduced temperatures described herein. In another implementation, higher order silanes, such as $Si_2H_6$, $Si_3H_8$, and $Si_4H_{10}$, may be utilized due to the reduced decomposition energy associated with the higher order silanes. Alternatively, germanium hydrides, such as $GeH_3$ may be utilized to further assist Cl desorption from the silicon dominated S/D regions surface. In one implementation, the resulting silicide formed is believed to be in the low resistance c54-$TiSi_2$ phase which exhibits a resistivity between 13-16 $\mu\Omega/cm^2$.

The titanium precursor and the silicon precursors utilized to form the silicide may be co-flowed or pulsed in an alternating manner during the thermal CVD process. In another implementation, $SiCl_4$, $SiCl_3H$, $SiCl_2H_2$, $SiCl_2$, $SiClH_4$, HCl, $Cl_2$, $GeCl_4$, $GeCl_2$, and combinations and mixtures thereof are also co-flowed, pulsed, or periodically pulsed during the silicide formation process. It is believed that supplementing H reduces etching of the silicon in the S/D regions and the additional supply of Cl may be utilized to maintain desirable selectivity during silicide deposition (i.e. self-aligned silicide formation predominantly on the S/D regions preferential to other structures and materials).

The utilization of additional precursors and the corresponding materials associated therewith are also believed to reduce pinhole density or entirely eliminate pinholes to generate a silicide with uniform growth characteristics across the S/D region interface. It is contemplated that silicide alloys having up to about 10% Ge ($Ti(Si_{0.9}Ge_{0.1})_2$) utilizing germanium containing precursors also provide desirable silicide characteristics, such as film and contact resistivity and thermal stability. In this implementation, the film resistivity may be about 15 $\mu\Omega/cm$ and the contact resistivity maybe be about $2E^{-9}$ $\Omega/cm^2$.

The silicide formation process may also be utilized with the formation of wrap around contact structures or "gouged" S/D structures for increased contact area integration schemes. It is contemplated that the selective and conformal nature of the silicide deposition process may be advantageously utilized in "tall" fin field effect transistors (FinFET) and horizontal gate all around (hGAA) transistor architectures.

Figure 2:
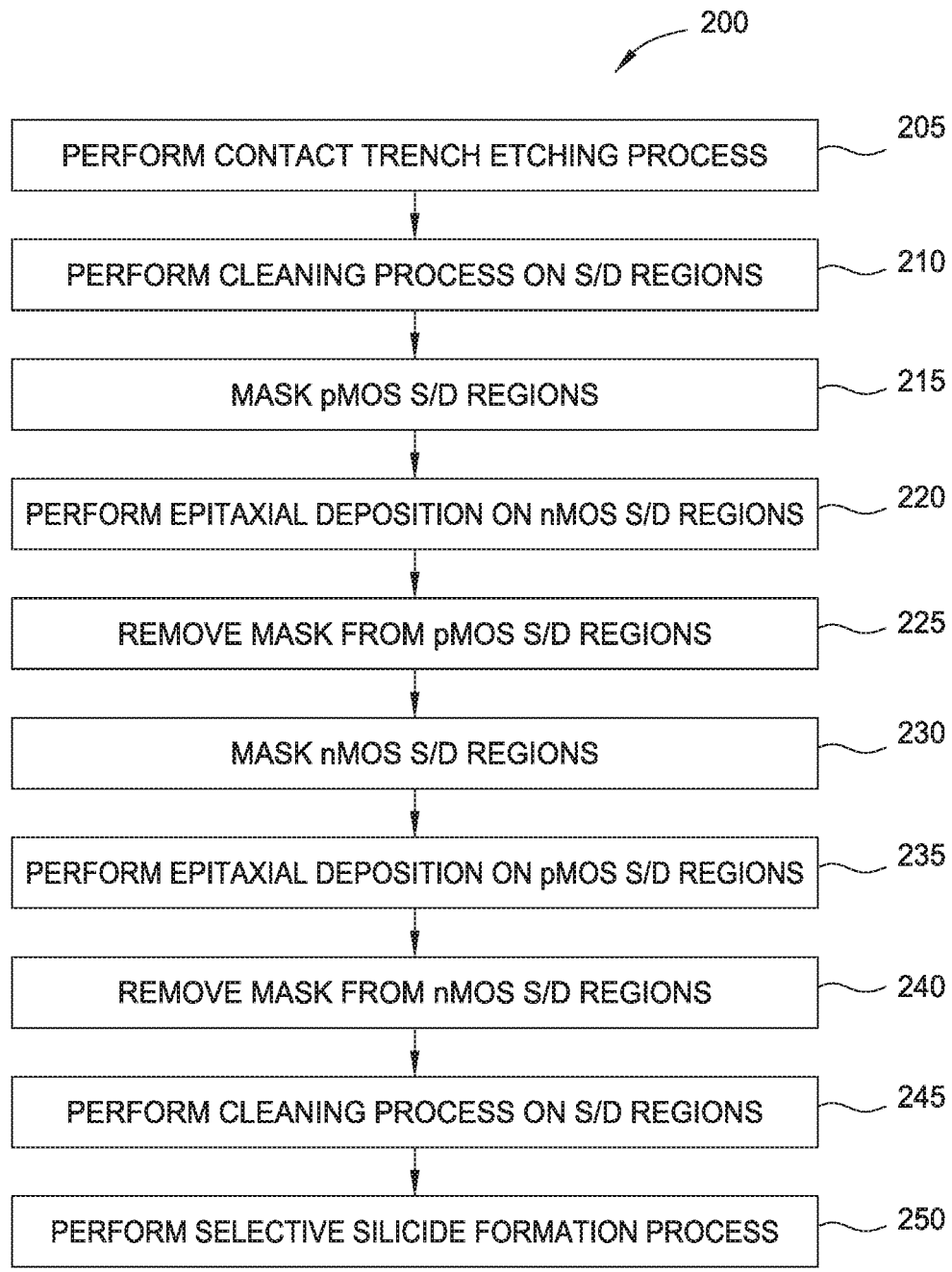
FIG. 2 illustrates operations of a method according to one implementation described herein.

FIG. 2 illustrates operations of a method 200 for performing a selective silicide formation process. At operation 205, a contact trench etching process is performed and cleaning process is performed on the S/D regions at operation 210. Operations 205 and 210 are similar to operations 110 and 120, respectively, in certain implementations. At operation 215, pMOS S/D regions are masked. Suitable masks, such as nitride materials and carbon containing materials, are selectively formed over the pMOS S/D regions to prevent deposition thereon during epitaxial deposition on nMOS S/D regions in operation 220. Deposition on the nMOS S/D regions may include highly doped SiP materials, phosphide materials, silicon materials, silicon germanium materials and phosphorous doped silicon germanium materials.

At operation 225, the mask is removed from the pMOS S/D regions and the nMOS S/D regions are masked in operation 230. The masks utilized for the nMOS S/D regions are similar to those utilized for the pMOS S/D regions and at operation 235, an epitaxial deposition process is performed on the pMOS S/D regions. Deposition on the pMOS S/D regions may include highly doped GeB, boron materials, germanium materials, silicon germanium materials, and boron doped silicon germanium materials. At operation, 240, the mask is removed from the nMOS S/D regions.

At operation 245, a cleaning process, such as the cleaning process described with regard to operation 140, is performed on the S/D regions. At operation 250, a selective silicide formation process is performed similar to the process described with regard to operation 150. It is contemplated that each of operations 150 and 250 may utilized adjusted process variables to improve the silicide formation in response to the type of device structure and material present in the S/D region.

In each of method 100 and method 200, the selective silicide formation processes provide for selective silicide material formation with desirable resistivity properties. The methods 100, 200 enable silicide formation without utilizing pre-amorphization implantation, post transformation rapid thermal annealing, or removal of unreacted Ti, thus, simplifying and increasing the efficiency of advanced contact integration schemes.

While the foregoing is directed to implementations of the present disclosure, other and further implementations of the disclosure may be devised without departing from the basic scope thereof, and the scope thereof is determined by the claims that follow.

What is claimed is:
1. A silicide formation method, comprising:
performing a contact trench etching process to expose source/drain (S/D) regions;
performing a cleaning process on the exposed S/D regions;
performing an epitaxial germanium deposition on the S/D regions, wherein the epitaxially deposited germanium is doped with gallium; and
performing a silicide formation process on the S/D regions by exposing the epitaxially deposited germa- nium to a titanium containing precursor and a silicon containing precursor at a temperature less than about 550° C.

2. The method of claim 1, wherein the titanium containing precursor is selected from the group consisting of $TiCl_4$, $TiBr_4$, and $TiI_4$.

3. The method of claim 2, wherein the titanium containing precursor is $TiCl_4$.

4. The method of claim 1, wherein the silicon containing precursor is selected from the group consisting of $SiH_4$, $Si_2H_6$, $Si_3H_8$, and $Si_4H_{10}$.

5. The method of claim 4, wherein the silicon containing precursor is $SiH_4$.

6. The method of claim 1, wherein the titanium containing precursor and the silicon containing precursor are co-flowed during the silicide formation process.

7. The method of claim 1, wherein the titanium containing precursor and the silicon containing precursor are pulsed in an alternating manner during the silicide formation process.

8. The method of claim 1, further comprising:
exposing the S/D regions to a germanium hydride material during the silicide formation process.

9. The method of claim 8, wherein the germanium hydride material is $GeH_3$.

10. The method of claim 1, wherein the silicide formation process is performed by thermal chemical vapor deposition at less than about 500° C.

11. The method of claim 1, further comprising:
exposing the S/D regions to a chlorine containing precursor during the silicide formation process.

12. The method of claim 11, wherein the chlorine containing precursor is selected from the group consisting of $SiCl_4$, $SiCl_3H$, $SiCl_2H_2$, $SiCl_2$, $SiClH_4$, $HCl$, $Cl_2$, $GeCl_4$, $GeCl_2$, and combinations and mixtures thereof.

13. The method of claim 1, wherein the silicide formation process forms a c54 phase titanium silicide material.

14. The method of claim 13, wherein the titanium silicide material has a resistivity of between about 13 $\mu\Omega/cm^2$ and about 16 $\mu\Omega/cm^2$.

15. A silicide formation method, comprising:
performing a contact trench etching process to expose source/drain (S/D) regions, wherein the exposed S/D regions comprise Group IV materials;
performing an oxide removal process on the exposed S/D regions;
performing an epitaxial germanium deposition on the S/D regions; and
performing a thermal chemical vapor deposition silicide formation process on the S/D regions by exposing the epitaxially deposited germanium to a titanium containing precursor and a silicon containing precursor at a temperature less than about 500° C. to form a silicide material alloy comprising titanium, silicon, and germanium, wherein the germanium is present in the alloy in a concentration of less than 10%.

16. The method of claim 15, wherein S/D regions are configured as nMOS type devices.

17. The method of claim 15, wherein the S/D regions are configured as pMOS type devices.

18. A silicide formation method, comprising:
performing a contact trench etching process to expose pMOS type and nMOS type source/drain (S/D) regions;
performing a first cleaning process on the exposed S/D regions;
masking pMOS type S/D regions;
performing an epitaxial germanium deposition on the pMOS type S/D regions;
removing the mask from the pMOS type S/D regions;
masking nMOS type S/D regions;
performing an epitaxial germanium deposition on the nMOS type S/D regions;
removing the mask from the nMOS type S/D regions;
performing a second cleaning process on the S/D regions; and
performing a silicide formation process on the S/D regions by exposing the epitaxially deposited germanium to a titanium containing precursor and a silicon containing precursor at a temperature less than about 550° C.

19. The method of claim 18, wherein the silicide formation process forms a silicide material alloy comprising titanium, silicon, and germanium, and wherein the germanium is present in the alloy in a concentration of less than 10%.

20. A silicide formation method, comprising:
performing a contact trench etching process to expose source/drain (S/D) regions;
performing a cleaning process on the exposed S/D regions;
performing an epitaxial germanium deposition on the S/D regions; and
performing a silicide formation process on the S/D regions by exposing the epitaxially deposited germanium to a titanium containing precursor, a chlorine containing precursor, and a silicon containing precursor at a temperature less than about 550° C.

* * * * *